United States Patent [19]
Paulsen et al.

[11] Patent Number: 5,123,994
[45] Date of Patent: Jun. 23, 1992

[54] RAMPED OXIDE FORMATION METHOD

[75] Inventors: James D. Paulsen, Tempe; Mark D. Griswold, Chandler, both of Ariz.

[73] Assignee: Motorola, Inc., Schaumburg, Ill.

[21] Appl. No.: 357,838

[22] Filed: May 30, 1989

[51] Int. Cl.⁵ .............................................. C30B 31/16
[52] U.S. Cl. .................................. 156/603; 156/600; 156/605; 156/DIG. 64; 156/DIG. 73; 437/238; 437/239
[58] Field of Search ....... 156/600, 603, 605, DIG. 64, 156/DIG. 73; 437/238, 239

[56] References Cited

U.S. PATENT DOCUMENTS

| | | | |
|---|---|---|---|
| 4,154,873 | 5/1979 | Hickox et al. | 437/239 |
| 4,167,915 | 9/1979 | Toole et al. | 156/DIG. 64 |
| 4,275,093 | 6/1981 | Sasaki et al. | 156/DIG. 64 |
| 4,380,865 | 4/1983 | Frye et al. | 156/603 |
| 4,518,630 | 5/1985 | Grasser | 437/238 |
| 4,540,452 | 9/1985 | Croset et al. | 156/DIG. 64 |
| 4,731,343 | 3/1988 | Beinvogel | 437/238 |
| 4,789,560 | 12/1988 | Yen | 437/238 |

FOREIGN PATENT DOCUMENTS

| | | | |
|---|---|---|---|
| 54-21266 | 2/1979 | Japan | 437/238 |
| 59-3932 | 1/1984 | Japan | 156/DIG. 73 |
| 60-20904 | 5/1985 | Japan | 437/238 |
| 61-53771 | 3/1986 | Japan | 156/600 |
| 62-182186 | 8/1987 | Japan | 156/603 |

OTHER PUBLICATIONS

Ghandhi, "VLSI Fabrication Principles, Silicon and Gallium Arsenide", John Wiley and Sons, New York, 1983, pp. 385-388.

*Primary Examiner*—Robert Kunemund
*Attorney, Agent, or Firm*—Harry A. Wolin

[57] ABSTRACT

A method for forming high quality oxides wherein semiconductor material is placed in an oxidizing environment and subjected to a predetermined concentration of oxygen. This oxygen concentration is increased over time until a predetermined amount of oxide has been formed. Once the predetermined amount of oxide has been formed, the semiconductor material/oxide interface is subjected to a burst of steam that passivates the interface thereby reducing the number of unreacted semiconductor material atoms.

13 Claims, 1 Drawing Sheet

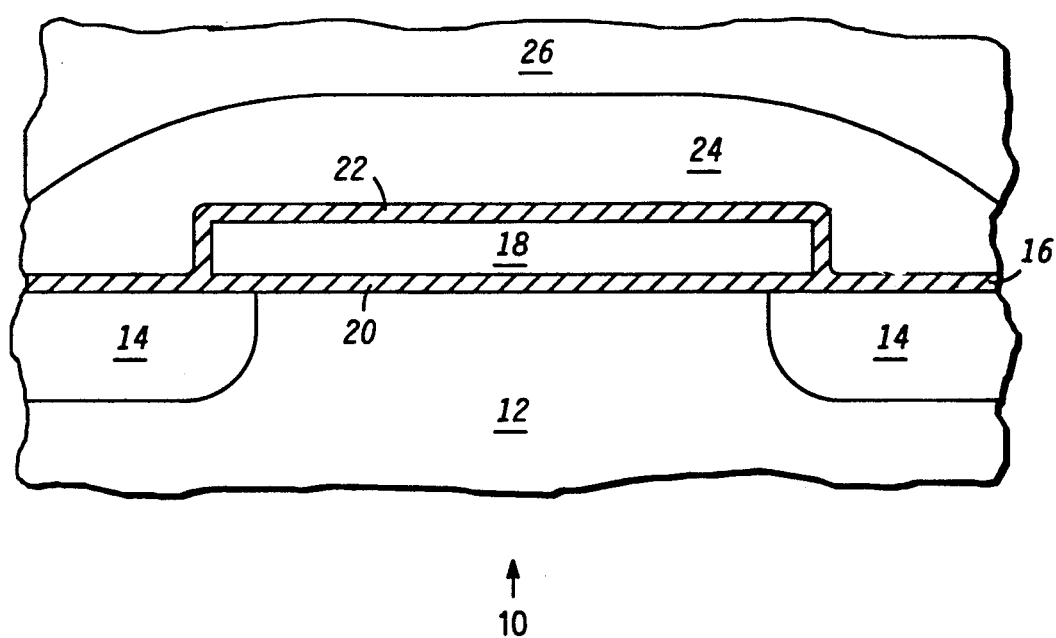

RAMPED OXIDE FORMATION METHOD

BACKGROUND OF THE INVENTION

This invention relates, in general, to an oxide formation method, and more particularly to a ramped oxide formation method Prior art methods of forming high quality oxide layers have generally encountered many problems. In memory devices employing Fowler-Nordheim tunneling that employ the oxidation of polysilicon gates, it is desirable to keep temperatures in the range of approximately 900 to 1000 degrees centigrade to preserve endurance characteristics of the device. If the oxidation occurs at a higher temperature (1050 to 1100 degrees centigrade), the tunnel oxide is often degraded. If lower temperatures are employed, the oxide formed on the polysilicon gate is generally of a low quality because the poor grain structure results in a rough oxide surface (asperities).

Prior art oxidation methods have included dilute oxidation throughout the entire cycle wherein oxygen is diluted with an inert gas. Generally, dilute oxidation methods are relatively slow because it takes longer for oxygen to reach the polysilicon/oxide interface as the oxide becomes thicker. Additionally, the temperature constraints mentioned above are prevalent. Two step oxidations wherein a dilute oxygen flow is initially employed and then a substantially higher flow is later employed are also commonly used. However, if the low oxygen flow is maintained too long, there will be oxygen starvation (dangling bonds) at the polysilicon/oxide interface. Nitrogen anneals often followed by short bursts of oxygen and hydrogen anneals have been employed to remedy the oxygen starvation problem at the polysilicon/oxide interface and although these anneals are somewhat successful, they are difficult to control and still leave a good deal of unreacted polysilicon at the interface.

SUMMARY OF THE INVENTION

Accordingly, it is an object of the present invention to provide a method for forming high quality oxides that allows for increased device endurance.

Another object of the present invention is to provide a method for forming high quality oxides wherein a diffusion controlled process is employed.

Yet another object of the present invention is to provide a method for forming high quality oxides that is time and temperature efficient.

An even further object of the present invention is to provide a method for forming high quality oxides wherein the oxygen flow is ramped.

It is an additional object of the present invention to provide a method for forming high quality oxides having a reduced number of dangling bonds at the semiconductor material/oxide interface.

Yet a further object of the present invention is to provide a method for forming high quality oxides in a memory device wherein oxides may be formed on polycrystalline material and other oxides simultaneously.

The foregoing and objects and advantages are achieved in the present invention by one embodiment in which, as a part thereof, includes providing a semiconductor structure having both polysilicon and single crystal surfaces and placing it into an oxidizing environment. The semiconductor structure is subjected to a predetermined concentration of oxygen which is increased over time until a predetermined amount of oxide has been simultaneously formed on both the polysilicon and the single crystal surfaces. A burst of steam comprising hydrogen and oxygen may then be employed to passivate the silicon/oxide interfaces.

A more complete understanding of the present invention can be attained by considering the following detailed description in conjunction with accompanying drawing.

BRIEF DESCRIPTION OF THE DRAWING

The single Figure is a highly enlarged cross-sectional view of a portion of a semiconductor memory device of a type that may be processed using the present invention.

DETAILED DESCRIPTION OF THE INVENTION

The single Figure is a highly enlarged cross-sectional view of a portion of a semiconductor memory device 10 of a type that may be processed using the present invention. Device 10 is depicted merely for exemplary purposes and it should be understood that the invention described herein may be used in conjunction with other types of devices. Device 10 comprises a silicon substrate 12 having doped regions 14 therein. A substrate oxide layer 16 is formed on substrate 12. A polysilicon floating gate 18 is shown disposed on substrate oxide layer 16. The portion of the substrate oxide layer 16 disposed beneath floating gate 18 is commonly called tunnel oxide and will be depicted by the number 20 herein. An interlevel oxide 22 is then formed to surround floating gate 18 and a polysilicon region 24 is formed on interlevel oxide 22. A dielectric layer 26 is then formed on polysilicon region 24.

In devices such as semiconductor memory device 10, it is highly desirable to form interlevel oxide 22 and additional oxide on substrate oxide layer 16 simultaneously. It is important that this oxide be of high quality and not degrade preexisting thin oxides such as tunnel oxide 20. The degradation of tunnel oxide 20 results in a device having extremely poor endurance characteristics.

High quality oxides may be formed in a temperature range of approximately 900 to 1000 degrees centigrade by providing only enough oxygen at a semiconductor material/oxide interface to react with the semiconductor material exactly at the interface. This allows for reduced amounts of partially reacted semiconductor material at the interface. As the oxide thickens, the oxygen concentration must be precisely increased over time (ramped upward) so that it may diffuse through the existing oxide and react only at the interface. The upward ramping of the oxygen concentration allows for a time and temperature efficient process that maintains a consistent oxidation rate in a diffusion controlled regime. This process allows for minimal oxide defectivity.

Once the ramping of the oxygen has been completed and predetermined amount of oxide formed, the semiconductor material/oxide interface should be oxygen starved. This means that there are partially reacted semiconductor material atoms at the interface. By subjecting the interface to a burst of steam comprising hydrogen and oxygen, the interface may be passivated and the number of unreacted atoms greatly reduced. It is important that the burst of steam only go the interface because its purpose is to reduce the number of unreacted semiconductor material atoms and not to significantly oxidize semiconductor material.

Referring back to device 10 of the Figure, interlevel oxide layer 22 may be formed simultaneously with additional oxide on substrate oxide layer 16 using the following specific process flow. After the semiconductor structure is placed in a reactor, the temperature is ramped upward over time to approximately 975 degrees centigrade. During this temperature ramping, a low concentration of oxygen (approximately 2.5 percent) in an inert carrier gas such as nitrogen (approximately 97.5 percent) is injected into the reactor. Once the desired temperature has been reached, an oxygen flow of approximately 5 percent is introduced into the reactor with an approximately 95 percent flow of nitrogen. This lasts approximately 40 minutes. The upward ramping of the oxygen concentration now begins and the oxygen flow is increased to approximately 30 percent while the inert carrier gas flow (nitrogen) is decreased to approximately 70 percent. This ramping takes place over approximately one hour and the oxygen concentration increases at a rate of 0.5% per minute.

Once the oxygen flow is ramped to 30 percent and the nitrogen flow is reduced to 70 percent, these flows are maintained for approximately one hour. At the end of this time period, approximately 550 angstroms of interlevel oxide 22 and 350 angstroms of substrate oxide 16 have been formed. Next, the structure is subjected to a burst of steam wherein the oxygen flow is approximately 35 percent, a hydrogen flow is approximately 14 percent and the nitrogen flow is approximately 51 percent. This steam burst lasts approximately 3 minutes and 30 seconds and passivates the interface while additionally forming approximately 50 angstroms of oxide. Si/SiO$_2$ interface defects are greatly reduced by the OH radicals. Once the steam burst has been completed, the hydrogen and oxygen flows are eliminated and the temperature is ramped downward over time from 975 degrees centigrade until the structure is removed from the reactor.

Thus it is apparent that there has been provided, in accordance with the invention, an improved method for forming high quality oxides which meets the objects and advantages set forth above. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

I claim:

1. A method for forming high quality oxides comprising the steps of:
    providing semiconductor material;
    placing said semiconductor material into an oxidizing environment and subjecting said semiconductor material to a concentration of oxygen; and
    increasing the oxygen concentration over time so that oxidation occurs only at the semiconductor material/oxide interface until an amount of oxide has been formed.

2. The method of claim 1 wherein the temperature of the oxidizing environment is in the range of approximately 900 to 1000 degrees centigrade.

3. The method of claim 2 wherein the temperature of the oxidizing environment is approximately 975 degrees centigrade.

4. The method of claim 1 wherein the increasing step includes increasing the oxygen concentration from approximately 5 percent to approximately 30 percent.

5. The method of claim 4 wherein the oxygen concentration is increased at a rate of approximately 0.5 percent per minute.

6. The method of claim 1 further comprising the steps of subjecting the oxidized semiconductor material to steam to passivate the semiconductor material/oxide interface.

7. The method of claim 6 wherein the steam is comprised of hydrogen and oxygen.

8. A method for forming high quality silicon dioxide comprising the steps of:
    providing silicon material;
    placing said silicon material into an oxidizing environment and subjecting said silicon material to a concentration of oxygen;
    increasing the oxygen concentration over time until an amount of silicon dioxide has been formed; and
    subjecting said silicon material and silicon dioxide to steam to passivate the silicon material/silicon dioxide interface.

9. The method of claim 8 wherein the temperature of the oxidizing environment and the subjecting step is in the range of approximately 900 to 1000 degrees centigrade.

10. The method of claim 9 wherein the temperature of the oxidizing environment and the subjecting step is approximately 975 degrees centigrade.

11. The method of claim 8 wherein the increasing step includes increasing the oxygen concentration from approximately 5 percent to approximately 30 percent.

12. The method of claim 11 wherein the oxygen concentration is increased at a rate of approximately 0.5 percent per minute.

13. The method of claim 8 wherein the subjecting includes using a stream comprising hydrogen and oxygen.

* * * * *